US009536781B2

(12) United States Patent
Gallegos et al.

(10) Patent No.: US 9,536,781 B2
(45) Date of Patent: Jan. 3, 2017

(54) METHOD OF MAKING INTEGRATED CIRCUIT

(71) Applicant: Texas Instruments Incorporated, Dallas, TX (US)

(72) Inventors: Bernardo Gallegos, McKinney, TX (US); Abram Castro, Fort Worth, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 35 days.

(21) Appl. No.: 14/831,163

(22) Filed: Aug. 20, 2015

(65) Prior Publication Data
US 2015/0357238 A1    Dec. 10, 2015

Related U.S. Application Data

(62) Division of application No. 13/481,275, filed on May 25, 2012, now Pat. No. 9,142,472.
(Continued)

(51) Int. Cl.
*H01L 21/768* (2006.01)
*H01L 21/48* (2006.01)
(Continued)

(52) U.S. Cl.
CPC ....... *H01L 21/76858* (2013.01); *H01L 21/486* (2013.01); *H01L 21/4853* (2013.01); *H01L 21/4857* (2013.01); *H01L 21/4871* (2013.01); *H01L 21/565* (2013.01); *H01L 21/568* (2013.01); *H01L 23/3135* (2013.01); *H01L 24/05* (2013.01); *H01L 24/20* (2013.01); *H01L 24/03* (2013.01); *H01L 24/13* (2013.01); *H01L 24/19* (2013.01); *H01L 2224/02311* (2013.01); *H01L 2224/02313* (2013.01);
(Continued)

(58) Field of Classification Search
CPC .............. H01L 2224/0401; H01L 2224/13025; H01L 2225/06513; H01L 21/563; H01L 21/76802; H01L 21/76805; H01L 23/142; H01L 23/3107; H01L 23/3114; H01L 23/3121; H01L 23/3128; H01L 23/488; H01L 23/49811; H01L 23/49816; H01L 23/52; H01L 23/522; H01L 23/5226; H01L 23/5329; H01L 23/53295; H01L 23/5389
USPC ......... 438/25, 26, 51, 55, 64, 112, 121, 122, 438/124–127, FOR. 367, FOR. 379, 438/FOR. 384
See application file for complete search history.

(56) References Cited

U.S. PATENT DOCUMENTS

2008/0246126 A1* 10/2008 Bowles ............... H01L 23/3114 257/659
2008/0308917 A1* 12/2008 Pressel ................ H01L 23/5389 257/676

(Continued)

*Primary Examiner* — John P Dulka
(74) *Attorney, Agent, or Firm* — John R. Pessetto; Charles A. Brill; Frank D. Cimino

(57) ABSTRACT

Methods of fabricating integrated circuits are disclosed herein. A die having a side is provided. A conductive stud extends from the side in a direction that is substantially normal to the side. A first dielectric layer is affixed to the side of the die. The first dielectric layer has a first side and a second side. The first side of the first dielectric layer is affixed to the side of the die. The conductive stud pierces the first side of the first dielectric layer. A first via is formed through the first dielectric layer between the conductive stud and the second side. The first via is electrically connected to the conductive stud.

12 Claims, 7 Drawing Sheets

Related U.S. Application Data

(60) Provisional application No. 61/596,617, filed on Feb. 8, 2012, provisional application No. 61/538,365, filed on Sep. 23, 2011.

(51) Int. Cl.
*H01L 21/56* (2006.01)
*H01L 23/31* (2006.01)
*H01L 23/00* (2006.01)

(52) U.S. Cl.
CPC .............. *H01L 2224/02319* (2013.01); *H01L 2224/0346* (2013.01); *H01L 2224/03436* (2013.01); *H01L 2224/0401* (2013.01); *H01L 2224/04105* (2013.01); *H01L 2224/12105* (2013.01); *H01L 2224/131* (2013.01); *H01L 2924/12042* (2013.01); *H01L 2924/181* (2013.01)

(56) References Cited

U.S. PATENT DOCUMENTS

| | | | | |
|---|---|---|---|---|
| 2011/0241222 A1* | 10/2011 | Sezi | .................. | H01L 21/561 257/782 |
| 2013/0075894 A1* | 3/2013 | Gallegos | ............. | H01L 23/3128 257/737 |
| 2013/0240918 A1* | 9/2013 | Herrmann | ........... | H01L 33/0079 257/88 |

\* cited by examiner

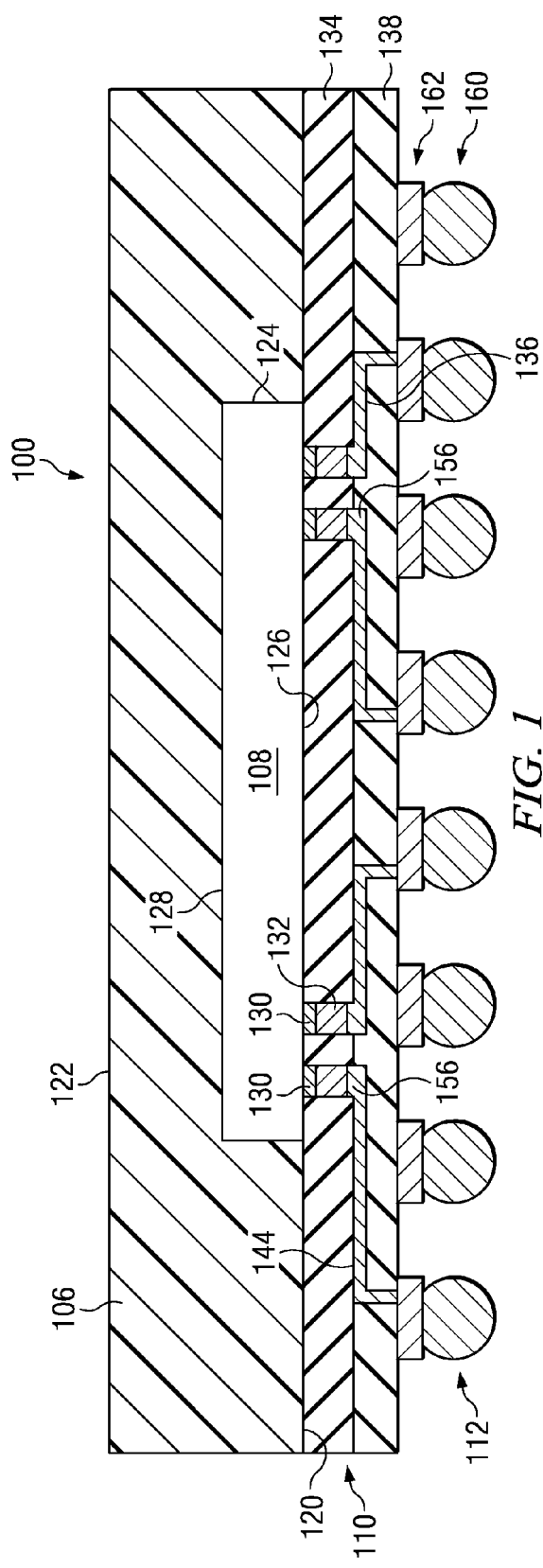
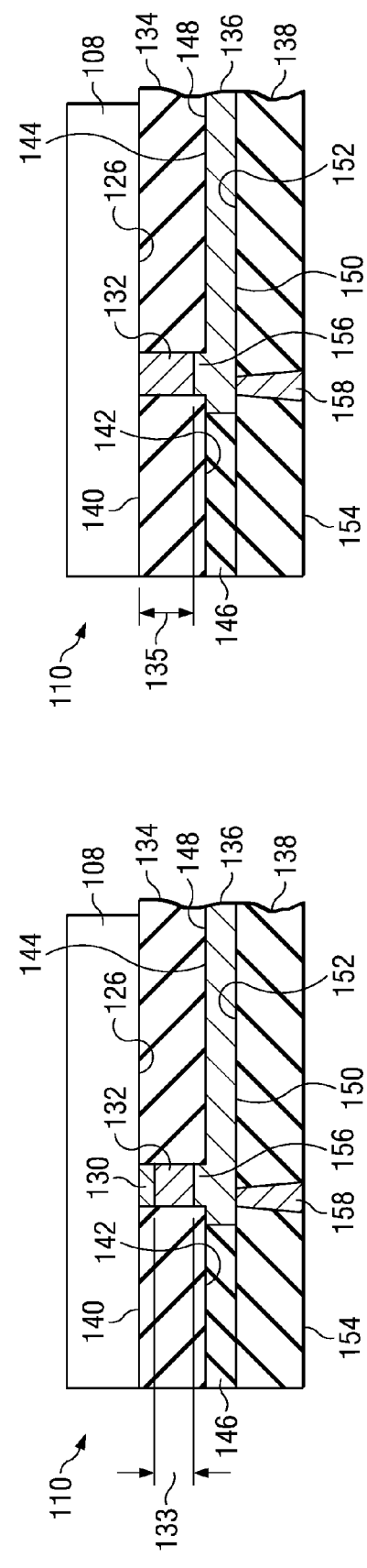
FIG. 1
FIG. 2
FIG. 3

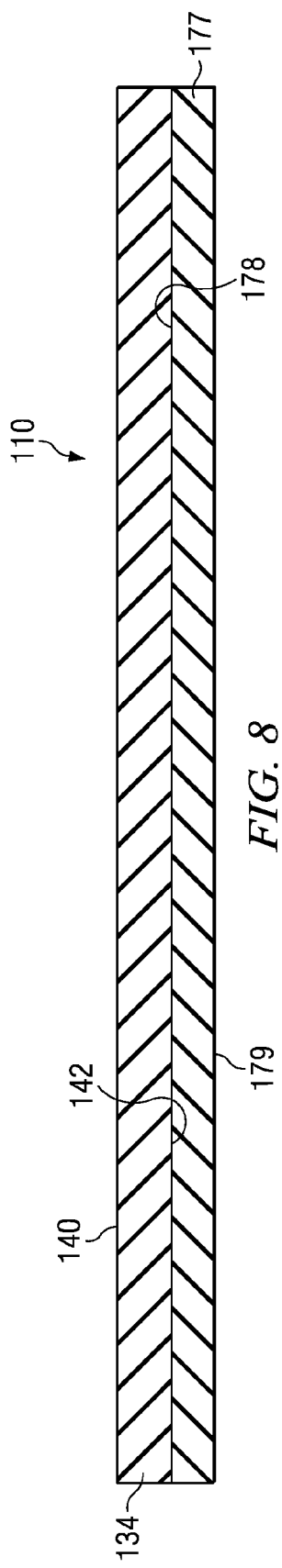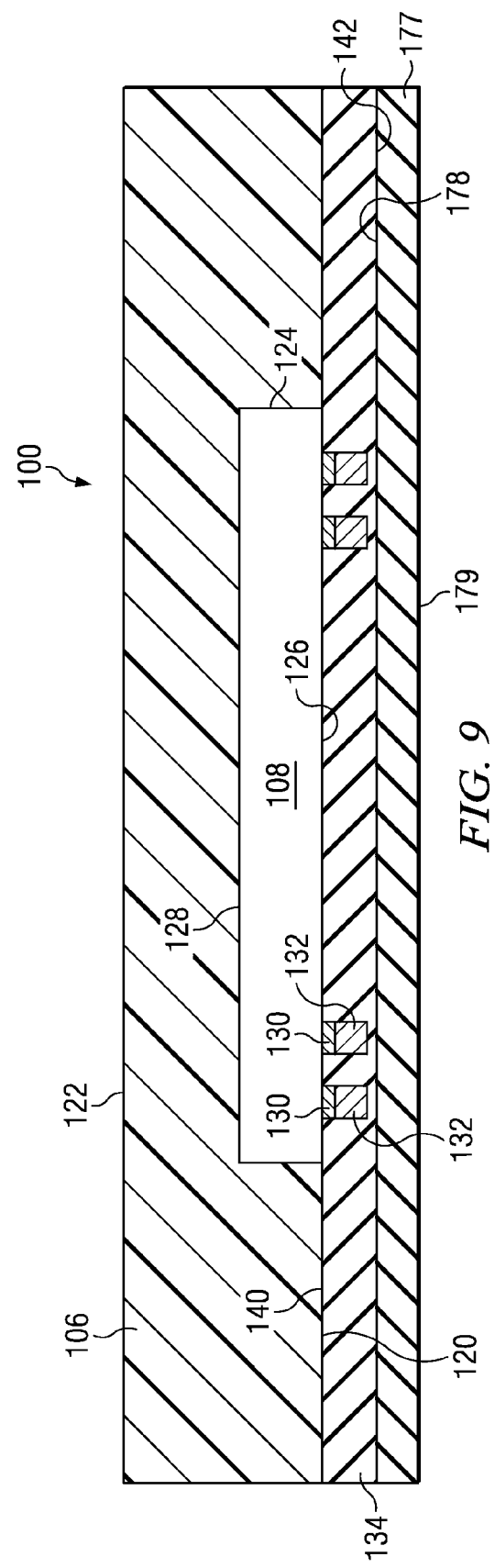

METHOD OF MAKING INTEGRATED CIRCUIT

CROSS-REFERENCE TO RELATED APPLICATIONS

This patent application is a Divisional of and claims priority to U.S. patent application Ser. No. 13/481,275 filed on May 25, 2012, which claims priority to U.S. provisional patent application 61/538,365 filed on Sep. 23, 2011 for PERMANENT CARRIER AND PACKAGE INTERCONNECT METHOD USING MOLD AND DISTRIBUTE APPROACH and U.S. provisional patent application 61/596,617 for INTEGRATED CIRCUIT AND METHOD OF MAKING filed on Feb. 8, 2012, which are all incorporated by reference for all that is disclosed therein.

BACKGROUND

Conventional integrated circuits have a die, which is a small circuit, electrically and/or mechanically connected to a lead frame or other connection mechanism. The electrical connection between the die and the lead frame typically consists of wire bonds connected between conductive pads on the die and conductors on the lead frame. The wire bonds are very small and delicate such that a small force applied to a wire bond can damage it. Therefore, extreme care must be taken when handling a circuit having wire bonds connected thereto. In addition to being very delicate, the wire bonds take time to connect, so they add to the cost and manufacturing time of the integrated circuit.

Many high speed and high frequency circuit applications require short leads connecting a die to a lead frame. Short leads reduce the chance of the die encountering electromagnetic interference and they affect the parasitic inductance and capacitance associated with the leads. Wire bonds are relatively long and add to the parasitic capacitance and inductance of the connection between the die and the lead frame of an integrated circuit. Wire bonds are also susceptible to electromagnetic interference.

After a conventional die is connected to a lead frame, the integrated circuit is encapsulated with an encapsulant. The encapsulation process is typically the final or near the final stage of fabrication of the integrated circuit. The encapsulant prevents contaminants from interfering with the integrated circuit. For example, the encapsulant prevents moisture from contaminating the die. The encapsulant also prevents the wire bonds from being damaged. Until the integrated circuit is encapsulated, the die, wire bonds, and other components are subject to failure by contact with contaminants. It follows that great care must be taken during the fabrication process in order to prevent the integrated circuits from being damaged prior to encapsulation.

BRIEF DESCRIPTION OF THE DRAWINGS

FIG. 1 is a side, cutaway view of an embodiment of an integrated circuit.

FIG. 2 is an enlarged view of a portion of the printed wiring board of the circuit of FIG. 1 attached to the die.

FIG. 3 is an embodiment of conductive studs used in the printed wiring board of FIG. 2.

FIG. 8 is a side elevation view of a first dielectric layer adhered to a sacrificial carrier.

FIG. 9 is a side elevation view of the dielectric layer and the sacrificial carrier of FIG. 8 affixed to the circuit of FIG. 5 wherein conductive studs on the die pierce the dielectric layer.

SUMMARY

Figure 4:
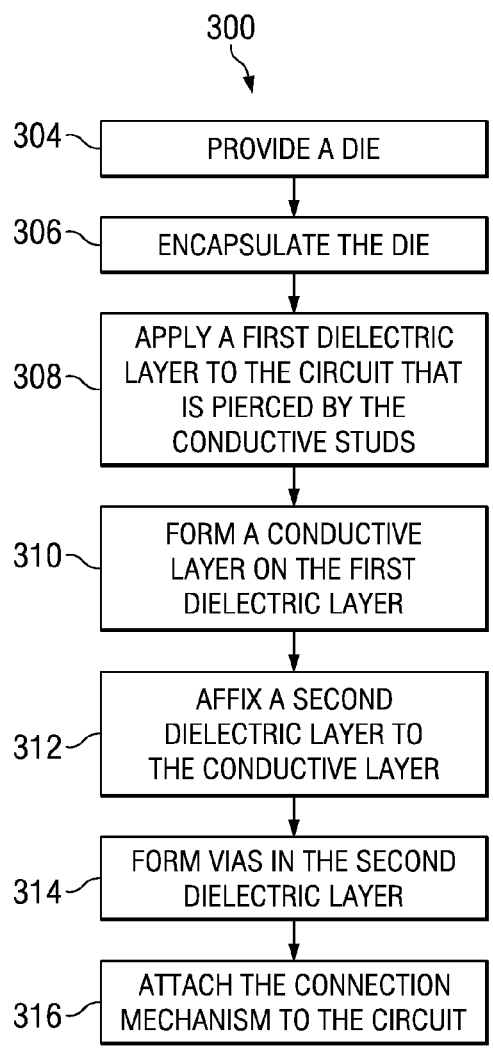
FIG. 4 is a flow chart describing an embodiment of a method of fabricating the circuit of FIG. 1.

Integrated circuits and methods of fabricating integrated circuits are disclosed herein. One embodiment of an integrated circuit includes a die having a side, wherein a conductive stud extends substantially normal relative to the side. A dielectric layer having a first side and a second side is located proximate the side of the die so that the first side of the dielectric layer is adjacent the side of the die. The conductive stud extends into the first side of the dielectric layer. A first via extends between the conductive stud and the second side of the dielectric layer. A conductive layer having a first side and a second side is located adjacent the second side of the dielectric layer, wherein the first side of the conductive layer is located adjacent the second side of the dielectric layer. At least a portion of the conductive layer is electrically connected to the first via.

DETAILED DESCRIPTION

Integrated circuits (referred to herein simply as "circuits") and methods of making circuits are disclosed herein. FIG. 1 is a side, cutaway view of a circuit 100. The circuit 100 includes an encapsulant 106, a die 108, a printed wiring board 110, and a connection mechanism 112. Embodiments of methods for fabricating the circuit 100 are described in greater detail further below.

The encapsulant 106 may be a conventional encapsulant commonly used to encapsulate integrated circuits or electronic devices. In some embodiments, the encapsulant 106 is applied by a transfer mold process. The encapsulant 106 has a first side 120 and a second side 122 located opposite the first side 120. A void 124 that is sized to receive the die 108, as described in greater detail below, is located in the first side 120. In many embodiments, the encapsulant 106 is molded around the die 108, so the void 124 is a recessed portion of the encapsulant 106 that is formed at the location of the die 108 during the encapsulation process.

The die 108 may be a conventional die that is commonly used in integrated circuits. The die 108 has a first side 126 and an opposite second side 128. The first side 126 of the die 108 forms a substantially continuous flat surface with the first side 120 of the encapsulant 106. Circuits and/or electronic devices (not shown) may be located in or on the die 108 in a conventional manner. For example, electronic devices may be fabricated on the second side 128. A plurality of conductive pads 130 may be located on the first side 126. The conductive pads 130 serve to electrically connect the die 108 to external devices or conductors. In some embodiments, the conductive pads 130 are contact points or the like that electrically and mechanically connect objects to the die 108. The conductive pads 130 may be very thin relative to other components of the circuit 100, however, for illustration purposes, they are shown as being substantially thick.

Conductive studs 132 are electrically and/or mechanically connected to the conductive pads 130. An enlarged view of a slightly different embodiment of the die 108 of FIG. 1 is shown in FIG. 2. The die 108 has a conductive stud 132 connected thereto. The conductive studs 132 may be substantially similar to copper pillars or copper bumps and may be fabricated by a copper bump process. The conductive studs 132 each may have a height 135 measured from the conductive pad 130 to the distal end of the stud 132.

A second and similar embodiment of the attachment of the stud 132 to the die 108 is shown in FIG. 3. In the embodiment of FIG. 3, there are no conductive pads 130 located on the die 108. Rather, the conductive stud 132 in this embodiment is affixed directly to the die 108. For example, an under bump metal (not shown) may be applied to the die 108 to connect the stud 132 to the die 108. In the embodiment of FIG. 3, the stud 132 extends a distance 135 from the surface 126 of the die 108. Alternatively, the conductive stud 132 may be a copper pillar similar or identical to those used in die and integrated circuit cooling.

The printed wiring board 110 is adhered to or fabricated to the first side 126 of the die 108 and may also be adhered to or fabricated to the first side 120 of the encapsulant 106. The printed wiring board 110 may contain several layers. In the embodiment of FIGS. 1-3, the printed wiring board 110 has three layers, a first dielectric layer 134, a conductive layer 136, and a second dielectric layer 138. The printed wiring board 110 may be fabricated separate from the circuit 100 and applied to the die 108 and the encapsulant 106 as a completed assembly. In other embodiments, the printed wiring board 110 is fabricated onto the die 108 and the encapsulant 106. Both fabrication methods are described below.

Referring to FIGS. 2 and 3, the first dielectric layer 134 has a first side 140 and a second side 142. The first side 140 is attached to or adhered to the first side 126 of the die 108, FIG. 1, and may also be attached to or adhered to the first side 120 of the encapsulant 106. The conductive layer 136 may be substantially similar to a redistribution layer in a die. The conductive layer 136 includes conductive material 144, such as copper, that serves as traces and nonconductive material 146 that is located between the conductive traces. The conductive material 144 may be metal, such as a copper foil similar or identical to copper foil used in subtractive processing, or plated in semi-additive or full additive form. An example of a copper foil includes a one half to two ounce copper foil. In other embodiments, the conductive material 144 may be a foil having several layers, such as a copper/aluminum/copper foil. The conductive layer 136 has a first side 148 and a second side 150, wherein the first side 148 is attached to or adhered to the second side 142 of the first dielectric layer 134. The nonconductive material 146 may be portions of either the first dielectric layer or the second dielectric layer 138. The second dielectric layer 138 has a first side 152 and a second side 154, wherein the first side 152 is attached to or adhered to the second side 150 of the conductive layer 136. Both the first dielectric layer 134 and the second dielectric layer 138 may be insulating materials that are commonly used in circuits.

The printed wiring board 110 serves to electrically and/or mechanically connect the die 108 to the connection mechanism 112. In order to achieve the electrical connections, a plurality of traces and vias may be located within the printed wiring board 110 to electrically connect the die 108 to the connection mechanism 112. As shown in FIGS. 1-3, the first dielectric layer 134 has a plurality of vias 156 extending between conductive studs 132 and the second side 142. The vias 156 electrically connect the conductive studs 132 on the die 108 to the conductive material 144 in the conductive layer 136 of the printed wiring board 110. The conductive studs 132 enable the vias 156 to be formed without damaging the die 108. For example, in some embodiments, the holes for the vias 156 are drilled into the first dielectric layer 134. The drilling process will cause contact with the conductive studs 132 and not the die 108. In other embodiments, chemicals are used to form the holes for the vias 156. Again, the chemicals will etch to the conductive studs 132 and not to the die 108. In both embodiments, harsh contact with the die 108 is avoided by making contact with the conductive studs 132 instead of the die 108. Because the conductive studs 132 extend from the surface 126 of the die 108 the conductive studs 132 can be drilled or etched slightly without the drilling or etching affecting the die 108.

The conductive layer 136 provides electrical conducting points at specific locations for the connection mechanism 112 by way of the conductive material 144. In the embodiment of FIGS. 1-3, vias 158 extend through the second dielectric layer 138 between the conductive layer 136 and the second side 154 of the second dielectric layer 138. It is noted that the connection mechanism 112 is electrically connected to the vias 158. Therefore, the connection mechanism 112 is electrically connected to the conductive pads 130 or other electrical contacts on the die 108.

The connection mechanism 112 may include a plurality of solder balls 160 that are electrically and mechanically connected to a plurality of conductors 162. The conductors 162 may be substantially similar to under bump metal layers used in semiconductor fabrication. The conductors 162 are electrically connected to the vias 158. It follows that electrical connections extend between the solder balls 160 and the conductive pads 130 on the die 108. It is noted that the solder balls 160 and conductors 162 are examples of devices for connecting the vias 158 to external devices and that other devices, such as pins or wire bonds, may be used to electrically connect the vias 158 to external devices.

Having described the structure of the circuit 100, methods of fabricating the circuit 100 will now be described. Reference is made to the flow chart 300 of FIG. 4, which describes a method of fabricating the circuit 100. Other fabrication methods are also described further below. The method described by the flow chart 300 includes initially providing a die 108, step 304, followed by encapsulating the die 108, step 306. As indicated at step 308, the first dielectric layer 134 is applied to the die 108 such that conductive studs 132 on the die 108 pierce into the first dielectric layer 134. A conductive layer 136 is formed on the first dielectric layer 134 as shown at step 309. A second dielectric layer 138 is adhered to the conductive layer 136 as shown at step 312. Vias 158 are formed in the second dielectric layer 138, step 314. The method concludes at step 316 with attaching a connection mechanism 112 to the second dielectric layer 138.

Having thus discussed a method of fabricating the circuit 100 in general terms, the method will now be described in detail. The fabrication of the circuit 100 commences with providing the die 108 as described at step 304 of the flow chart 300, FIG. 4. The die 108 is a conventional circuit that is fabricated onto a wafer or substrate. The die 108 may be similar to the type commonly used in integrated circuits. The die 108 may be a complete circuit meaning that no further circuit fabrication is required. However, the die 108 does need to be electrically connected to the connection mechanism 112 in order to power the die 108 and to send and receive signals as described below. As described above, the die 108 has or is connected to conductive studs 132 that serve to electrically connect the die 108 to the connection mechanism 112.

As previously mentioned, the conductive studs 132 may be substantially similar to copper bumps or copper pillars of the type that are conventionally used for cooling dies and integrated circuits. In other embodiments, the conductive studs 132 may be affixed to or fabricated onto the conductive pads 130 or other electrical contact points on the die 108 so as to be electrically and/or mechanically connected to the die 108. The conductive studs 132 may extend a distance 135, FIG. 3, from the surface 126 of the die 108, wherein the distance 135 is equal to or slightly less than the thickness 133 of the first dielectric layer 134. In some embodiments, the first dielectric layer has a thickness 133 of between ten and fifty microns. In such embodiments, the conductive studs 132 may extend a distance 135 of eight to forty-five microns from the surface 126 of the die 108.

Figure 5:
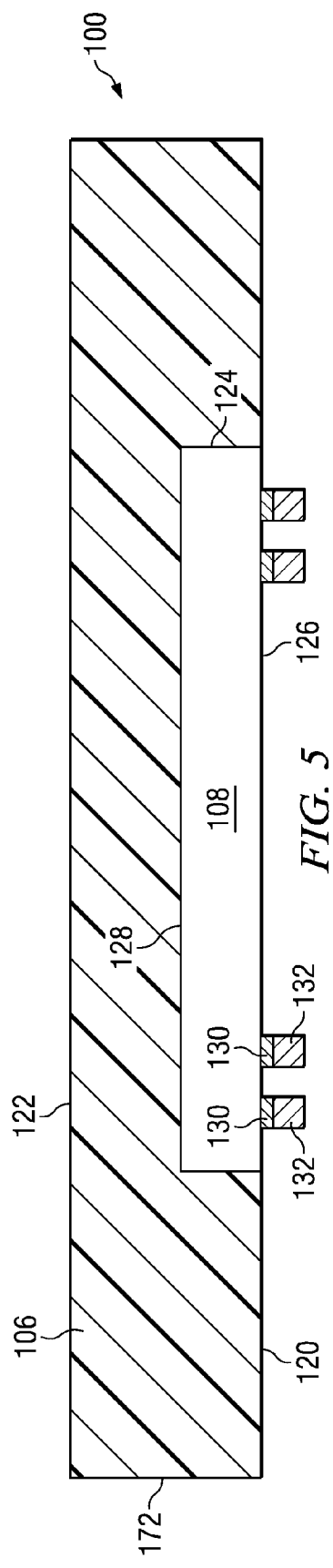
FIG. 5 is a side elevation view of the circuit of FIG. 1 in the process of being fabricated wherein the die therein has been encapsulated.
Figure 6:
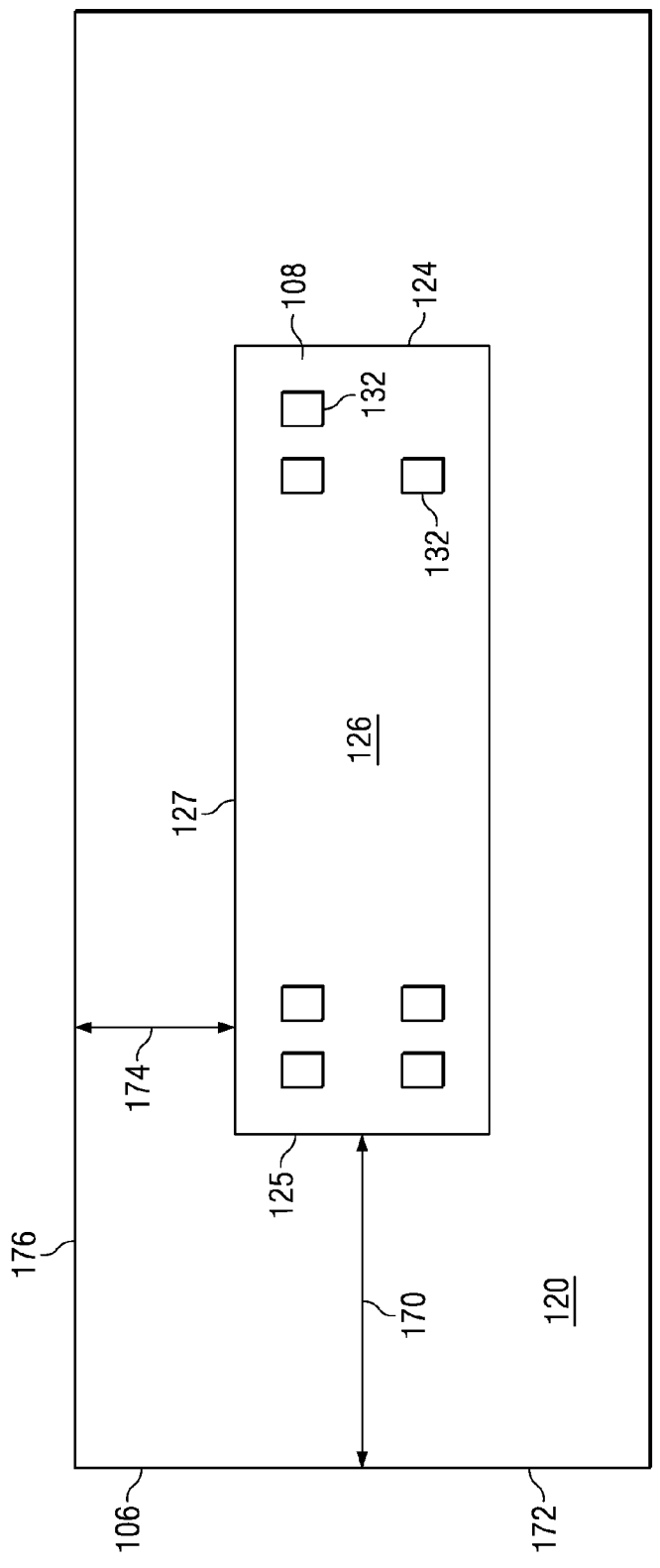
FIG. 6 is a bottom plan view of the circuit of FIG. 5.

The die 108 is encapsulated with the encapsulant 106 as described in step 306. The encapsulated die 108 is shown in FIG. 5, which is a side, cutaway, elevation view of the die 108 and the encapsulant 106. A bottom plan view of the encapsulated circuit 100 of FIG. 5 is shown in FIG. 6. The encapsulant 106 may be a conventional encapsulant used in the fabrication of integrated circuits. In some embodiments, a transfer mold technique is used to encapsulate the die 108. Encapsulating the die 108 at this stage of fabrication is unique. In conventional circuits, dies are not encapsulated until they are electrically connected to a connector or other connection device. For example, in flip-chip fabrication, the encapsulation process does not occur until a printed wiring board has been attached to the die. By encapsulating the die 108 at this stage of fabrication of the circuit 100, the die 108 may be handled or otherwise maneuvered with a lower probability of being damaged. The encapsulated die 108 is also less likely to become damaged by contaminants.

In the embodiments described herein, the entire die 108 except for the first side 126 is encapsulated. By encapsulating the die 108, except for the first side 126, at this point during fabrication, the die 108 is protected and the conductive studs 132 are accessible in order to connect the die 108 to the connection mechanism 112. As shown in FIGS. 5 and 6, the encapsulant 106 may extend laterally beyond the edges 125, 127 of the die 108, which enables the completed circuit 100 to fit snugly into larger packages. A first edge 172 of the encapsulant and a first edge 125 of the die 108 are spaced apart a distance 170. A second edge 176 of the encapsulant 106 and a second edge 127 of the die 108 are separated by a distance 174 as shown in FIG. 6. The distances 170, 174 determine the size of the first side 120 of the encapsulant 106, which may be substantially planar. The die 108 may be located in the encapsulant 106 in such a manner that the first side 126 of the die 108 and the first side 120 of the encapsulant 106 form a substantially planar and continuous surface.

The encapsulant 106 may be applied to the die 108 by different methods. For example, a liquid encapsulant may be molded over the die 108 and cured in a conventional manner. In other embodiments, a solid encapsulant may be formed with the void 124 located therein. The die 108 may be secured within the void 124 so that the die 108 is effectively encapsulated by the encapsulant 106. In yet other embodiments, the encapsulant 106 is cured simultaneously with the curing of the printed wiring board 110 or components in the printed wiring board 110. In such embodiments, the encapsulant 106 may be cured to a stage-B or jell state at this stage of fabrication. After the printed wiring board 110 is attached to the die 108 and the encapsulant 106, the encapsulant 106 and components in the printed wiring board 110 may then be cured simultaneously. The simultaneous curing may enhance the bond between the printed wiring board 110 and the encapsulant 106. For example, the encapsulant 106 and the first dielectric layer 134 are able to flow together in their jell state and then fully cure together.

Several different embodiments of applying the printed wiring board 110 to the die 108 will be described below. It is noted that the printed wiring board 110 replaces conventional wire bonds. Therefore, none of the embodiments of the circuit 100 described herein require wire bonds or the like between the die 108 and the connection mechanism 112. Accordingly, all the embodiments of the printed wiring board 110 enable very short distances between the die 108 and the connection mechanism 112, which reduces the parasitic capacitance and inductance associated with the electrical connection between the die 108 and the connection mechanism 112.

A first embodiment of applying the printed wiring board 110 to the circuit 100 commences with applying the first dielectric layer 134 to the circuit as described at step 308 of the flow chart 300. The application of the first dielectric layer 134, step 308, is described in greater detail by the flow chart 350 of FIG. 7, which will now be discussed. Reference is made to FIG. 8, which shows the first dielectric layer 134 adhered to a sacrificial carrier 177 as described in step 352 of the flowchart 350. The first dielectric layer 134 may be laminated to the sacrificial carrier 177 by a conventional low temperature vacuum lamination process. The first dielectric layer 134 may be a non-fibrous dielectric material, such as an Ajinomoto build-up film (ABF), produced by Ajinomoto Fine-Techno Co, Inc of Japan and Ajinomoto North America, Inc. of Fort Lee, N.J., USA. The first dielectric layer 134 may have a thickness of between ten and fifty microns. The material used in the first dielectric layer 134 may have a low viscosity prior to being cured. In order to keep the first dielectric layer 134 from sliding off the sacrificial layer 177 when it is in a state having a low viscosity, the first dielectric layer 134 may be cured to a B-stage wherein the first dielectric layer 134 has the viscosity of a jell. Such a curing enables the first dielectric layer 134 to be transported by way of the sacrificial carrier 177 and be adhered to the encapsulant 105 and die 108 as described below.

The sacrificial carrier 177 may be a metal, such as a copper foil. In some embodiments, the sacrificial carrier 177 is a one half to two ounce copper foil. In other embodiments, the sacrificial layer 177 may be a foil having several layers, such as a copper/aluminum/copper foil. The sacrificial carrier 177 has a first side 178 and a second side 179, wherein the first side 178 is adhered to or located adjacent the second side 142 of the first dielectric layer 134. The sacrificial carrier 177 is used to apply the first dielectric layer 134 to the encapsulant 106 and the die 108 by forming a rigid carrier to support the first dielectric layer 134 so that it can be pressed against the encapsulant 106 and the die 108.

At this stage of fabrication, the first dielectric layer 134 is adhered to the sacrificial carrier 177. The first dielectric layer 134 may then be transported or handled by using the sacrificial carrier 177, which reduces the likelihood of damage to the first dielectric layer 134 during handling. The jell state of the first dielectric layer 134 enables it to be applied to the circuit 100 as described at step 354 of the flow chart 350, which yields the circuit 100 as shown in FIG. 9. For example, the die 108 and the encapsulant 106 may be pressed onto the first dielectric layer 134. It is noted that in some embodiments, a large sheet of a first dielectric layer is adhered to a plurality of dies, which are singulated during a later stage of fabrication. As the first dielectric layer 134 and the sacrificial carrier 177 are pressed onto the die 108, the conductive studs 132 pierce the first dielectric layer 134. In some embodiments, the conductive studs 132 pierce the first dielectric layer 134 to a distance that is proximate the sacrificial carrier 177.

The partially cured jell state of the first dielectric layer 134 enables it to be easily adhered to or located adjacent all the die 108 and the encapsulant 106 and reduces or eliminates the potential for voids between surfaces. More specifically, if the encapsulant 106 is in a jell state, first dielectric layer 134 and the encapsulant 106 may flow together for better adhesion. The conductive pads 130 may be embedded into the jelled first dielectric layer 134. The first dielectric layer 134 and the encapsulant 106 may then be cured simultaneously as described at step 356 of the flow chart 350.

Figure 10:
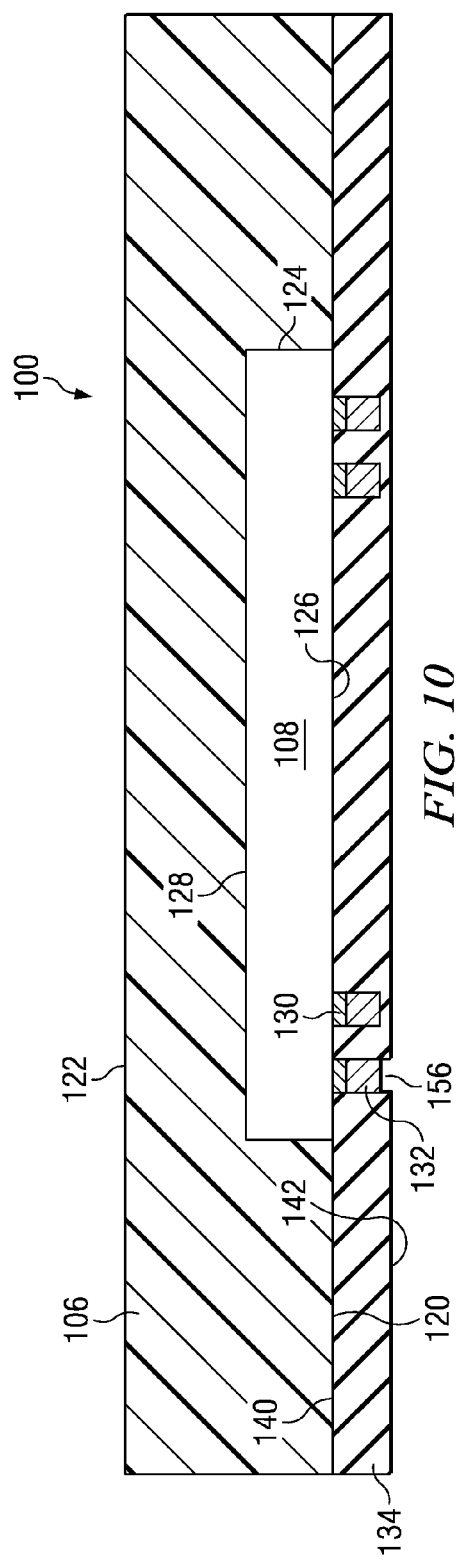
FIG. 10 is a side elevation view of the circuit of FIG. 9 with the sacrificial carrier removed and with holes for vias formed in the first dielectric layer.

The circuit 100 at this point in the fabrication process has the first dielectric layer 134 and the encapsulant 108 cured with the first dielectric layer 134 adhered to the die 108 and/or the encapsulant 108. The sacrificial carrier 177 is then removed as described in step 358 of the flow chart 350. In some embodiments, the sacrificial carrier 177 is etched away by a conventional etching process. The resulting circuit 100 is shown in FIG. 10. As shown, the circuit 100 has the first dielectric layer 134 affixed thereto and the sacrificial layer 177 has been removed.

As shown in FIG. 10, holes for the vias 156 are formed into the first dielectric layer 134 proximate the conductive pads 130 as described in step 360 of the flow chart 350. In one embodiment, a laser is used to form the holes. In other embodiments, the holes for the vias 156 are drilled or formed using chemicals. One of the benefits of the circuit 100 over other circuits is that the holes for the vias 156 are only formed to the conductive studs 132 and not to the die 108. Therefore, the conductive studs 132 and not the die 108 may be affected during formation of the holes. Because the conductive studs 132 are long, they can withstand contact with lasers, drilling equipment, and chemicals for a much longer period than the die 108 itself could otherwise withstand.

The holes for the vias 156 are plated or otherwise filled with a conductive material as described in step 362 of the flow chart 350. For example, a plating material may be applied to the first dielectric layer 134 in order to form conductive paths in the vias 156. Other methods may also be used to provide a conductive material to form the vias 156. For example, in some embodiments, the conductive material for the vias 156 is formed when the conductive layer 136 is applied to the first dielectric layer 134. In all embodiments, the vias 156 only extend between the conductive studs 132 and the second side 142 of the first dielectric layer 134.

Figure 7:
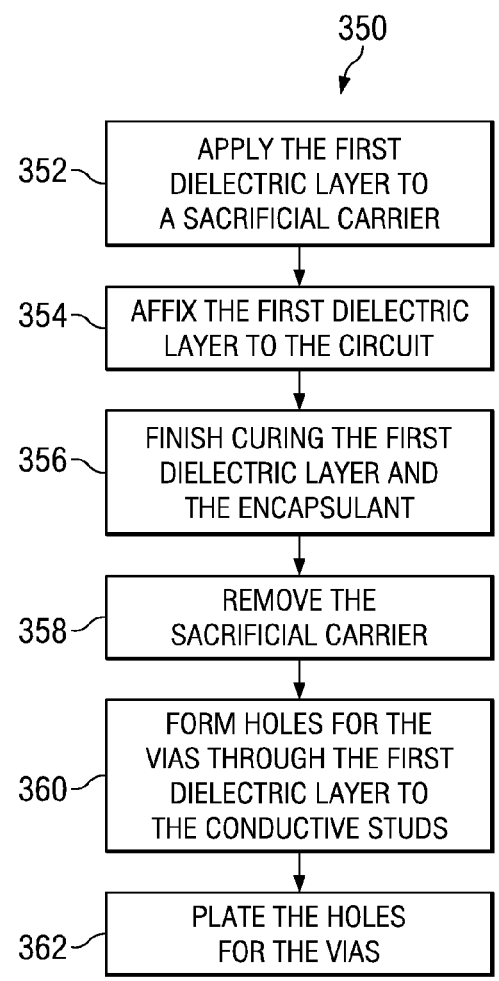
FIG. 7 is a flow chart describing an embodiment of a method of affixing the first dielectric layer to the circuit of FIG. 1.

Having thus described one embodiment of step 308 of FIG. 4 in detail with reference to flow chart 350 of FIG. 7, the remainder of method 300 of FIG. 4 will now be described commencing with step 310. In step 310 the conductive layer 136 is applied to the first dielectric layer. The conductive layer 136 may be applied in a manner similar to the manner in which a redistribution layer is applied to an integrated circuit. For example, a resist (not shown) may be applied to the second side 142 of the first dielectric layer 134. It is noted that if the holes for the vias 156 have not been plated, no resist may be applied proximate the holes. The conductive layer 136 may then be applied to the second side 142 of the first dielectric layer 134 by a conventional technique, such as plating. The conductive material 144, FIG. 2, will adhere to the first dielectric layer 134 in locations where the resist is not present, which may include the holes for the vias 156. The resulting circuit 100 is shown in FIG. 11, which shows the conductive material 144 in the conductive layer 136 connected to the vias 156.

Figure 11:
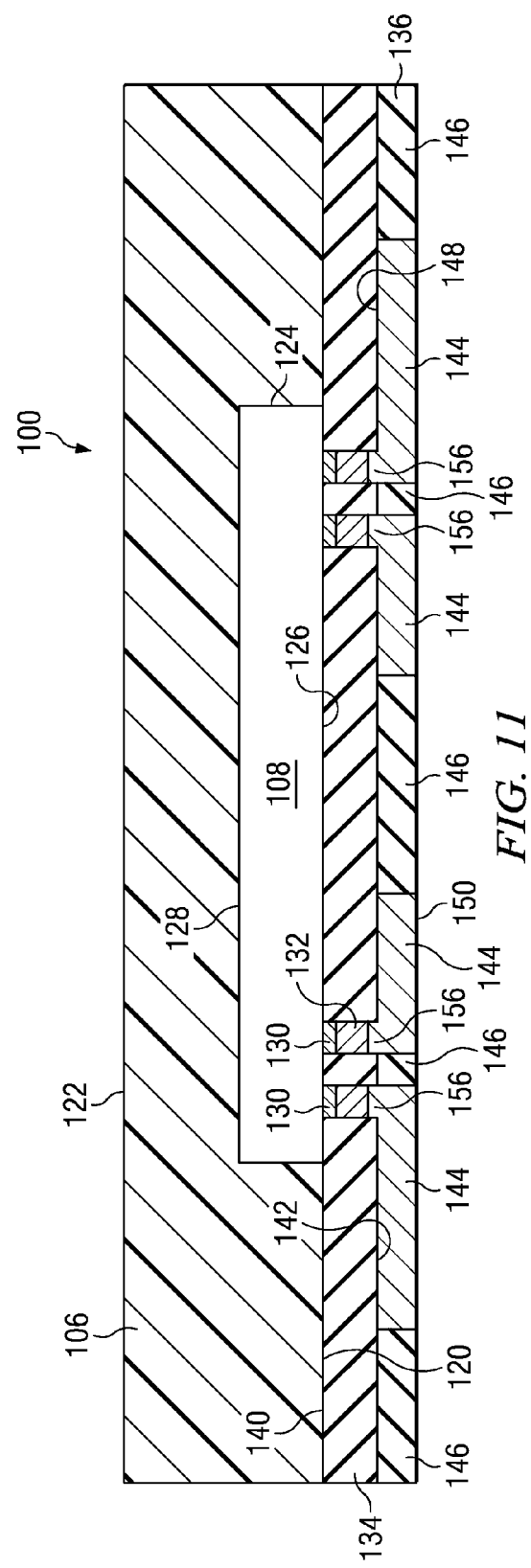
FIG. 11 is a side elevation view of the circuit of FIG. 10 with a conductive layer applied to the first dielectric layer wherein the conductive layer is connected to the vias.

In some embodiments, the circuit 100 as shown in FIG. 11 is complete. The circuit 100 is functional and may be connected to other devices by way of the printed wiring board 110. For example conductors may be connected to the conductive layer 136 in order to electrically connect the circuit 100 to other components.

Figure 12:
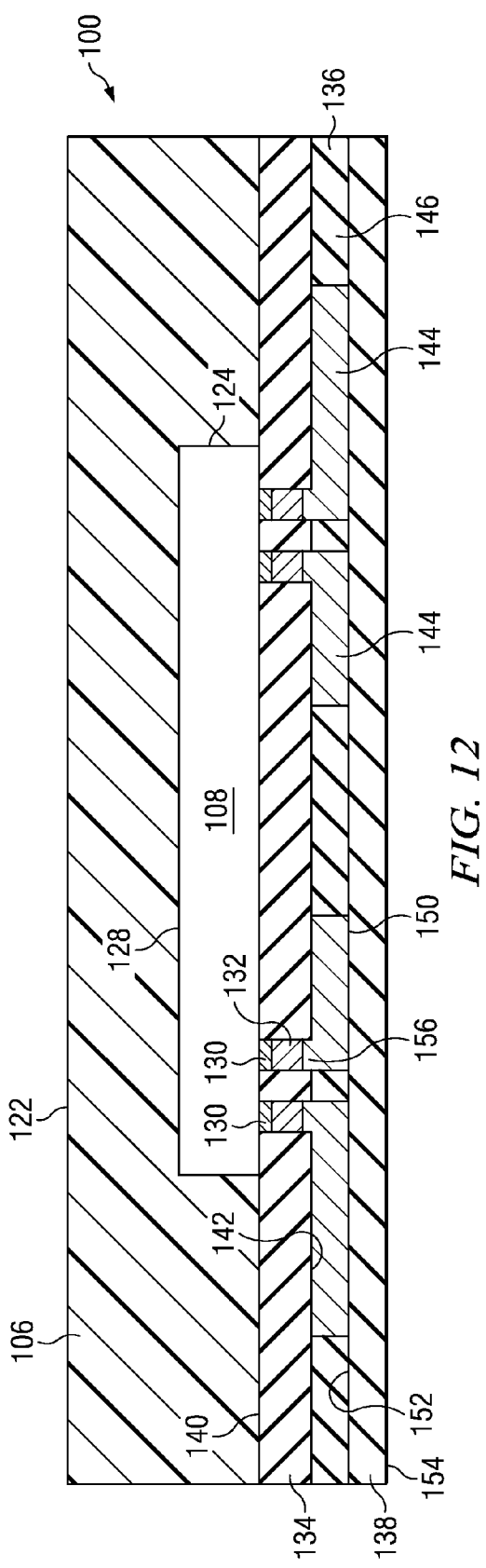
FIG. 12 is a side elevation view of the circuit of FIG. 11 with the addition of a second dielectric layer.
Figure 13:
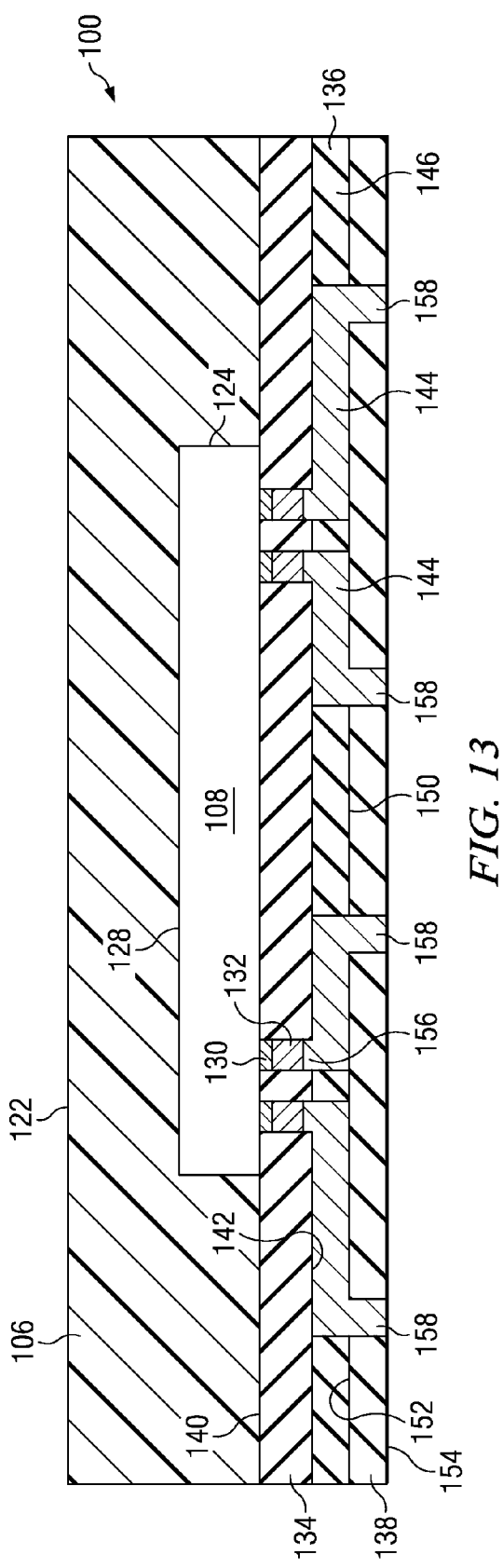
FIG. 13 is a side elevation view of the circuit of FIG. 12 with vias formed through the second dielectric layer.

In other embodiments of the circuit 100, the second dielectric layer 138 is affixed to the conductive layer 136 as described in step 312 of the flow chart 300 and as shown in FIG. 12. As described above, the second dielectric layer 138 has a first side 152 and a second side 154, wherein the first side 152 is adhered to or attached to the conductive layer 136. The second dielectric layer 138 may be substantially the same material as the first dielectric layer 134. The second dielectric layer 138 serves to protect the conductive layer 136 from damage during handling and from debris or other matter that may short or otherwise damage the conductive layer 134. In addition, the second dielectric layer 138 serves to support the connection mechanism 112.

The vias 158 are formed in the second dielectric layer 138 as described in step 314 of the flow chart 300 and as shown in FIG. 12. The vias 158 extend between the first side 152 and the second side 154 of the second dielectric layer 138. The vias 158 are fabricated by forming holes through the second dielectric layer 138 wherein the holes contact specific portions of the conductive material 144 of the conductive layer 136. The holes may be formed in the same way as the holes that are formed in the first dielectric layer 134 to fabricate the vias 156. Likewise, the holes may be filled with or plated with a conductive material to form the vias 158 in a manner similar to the way the vias 156 are formed.

The circuit 100 now has an encapsulated die 108 with electrical connections from the die 108 to the second side 154 of the second dielectric material 138. The connection mechanism 112 may now be affixed to the second side 154 of the second dielectric material 138 as described in step 316 of the flow chart 300 and as shown in FIG. 1. The connection mechanism 112 electrically and/or mechanically connects the circuit 100 to other devices. For example, the connection mechanism 112 may provide input and output signals to and from the die 108. The connection mechanism 112 may also enable the circuit 100 to be physically attached to a substrate (not shown), such as a printed circuit board, or other physical structure.

As briefly described above, the connection mechanism 112 may include a plurality of conductors 162 that are attached to the second side 154 of the second dielectric layer 138. The conductors 162 are electrically connected to the vias 158 in order to provide electrical connections to the die 108. The conductors 162 may be conventional metal layers, such as under bump metal layers that are commonly used to support solder balls 160. The solder balls 160 may be attached to the conductors 162 in a conventional manner.

The circuit 100 has many advantages over conventional integrated circuits. For example, the circuit 100 was encapsulated early in the production process. Therefore, the circuit 100 may be handled and maneuvered with a lower probability of becoming damaged during the remaining production processes. In addition, the circuit 100 is less susceptible to damage from contaminants during production.

The die 108 of the circuit 100 is less likely to be damaged by the formation of the first vias 156. As described above, the holes for the first vias 156 only need to extend between the second side 142 of the first dielectric layer 134 and the conductive studs 132. Hole formation, which can damage the die 108, does not have to extend to the die 108. Any damage caused by hole formation may shorten the conductive studs 132 rather than damage the die 108.

Electrically, the circuit 100 has many benefits over conventional integrated circuits. The circuit 100 does not require any wire bonds. Therefore, the circuit 100 is not subject to the increased parasitic capacitance or inductance associated with wire bonds. In addition, the conductive layer 136 enables the lead lengths between the conductive pads 130 on the die 108 and the connection mechanism 112 to be very short. The short distance reduces the electromagnetic interference that the circuit 100 is subject to. It follows that the circuit 100 is better suited to operate in high frequency, high speed, and low power applications.

Having described some embodiments of fabricating the circuit 100, other embodiments, will now be described. In some embodiments, the first dielectric layer 134 is applied directly to the die 108 and the encapsulant 106 without the use of the sacrificial carrier 177, FIG. 8. In such an application, the circuit 100 may be positioned so that the first side 120 of the encapsulant 106 and the first side 126 of the die 108 are facing up. The first dielectric layer 134 may then be applied to the first surface 120 of the encapsulant 106 and the first surface 126 of the die 108. The first dielectric layer 134 may then be cured wherein the curing may also simultaneously cure the encapsulant 106. Fabrication of the circuit 100 may continue from step 360 of the flow chart 350 as described above. In this embodiment, the first dielectric layer 134 is fabricated onto the die 108 with the conductive studs 132 located in the first dielectric layer 134.

In another embodiment of the fabrication process, the first dielectric layer 134 is adhered directly to the conductive layer 136 instead of being adhered to the sacrificial carrier 177, FIG. 8. No sacrificial carrier 177 is required to be removed in this embodiment. Rather, the conductive layer 136 and, more specifically, the conductive material 144 of the conductive layer 136, serves as a carrier for the first dielectric layer 134. The conductive material 144 may then be etched to form the conductive layer 136. The vias 156 may be formed as described above. The vias 156 may also be plated so that they electrically connect with the conductive material 144 of the conductive layer 136.

In other embodiments, heat spreaders are used in conjunction with or as an alternative to the encapsulant 106. For example, the die 108 may be located in a heat spreader prior to encapsulation. Alternatively, the die 108 may be located in a heat spreader in lieu of encapsulation.

Figure 14:
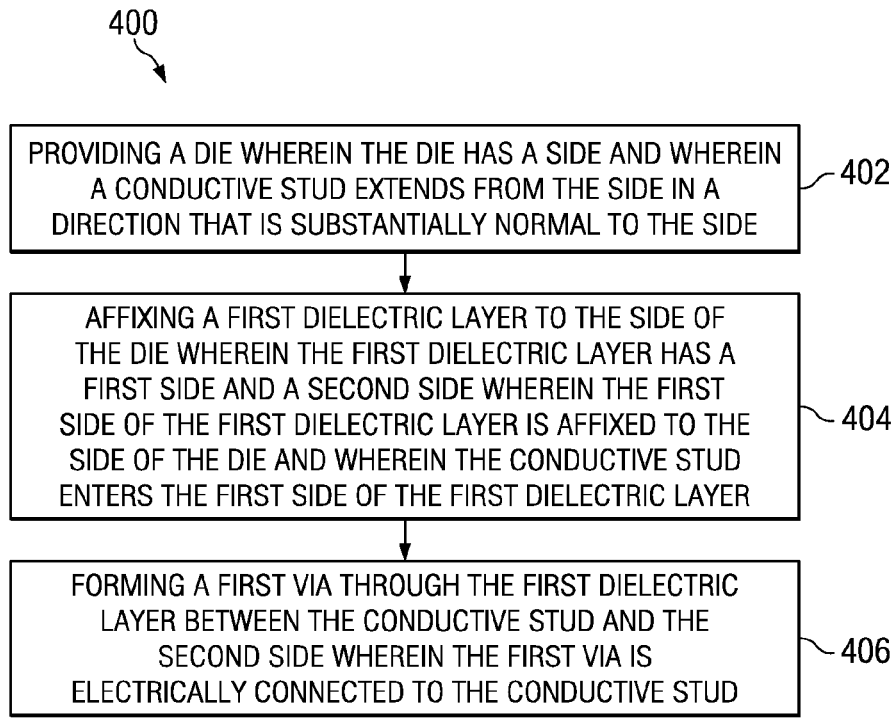
FIG. 14 is a flow chart describing another embodiment of fabricating the die of FIG. 1.

It will be appreciated from the above description that a method of fabricating a circuit may comprise the method set forth in the flow chart 400 of FIG. 14 with additional reference to FIG. 1. The method of the flow chart 400 commences at step 402 with providing a die 108 wherein the die 108 has side 126. A conductive stud 132 extends from the side 126 in a direction that is substantially normal to the side 126. The method continues at step 404 by affixing a first dielectric layer 134 to the side 126 of the die 108 wherein the first dielectric layer 134 has a first side 140 and a second side 142. The first side 140 of the first dielectric layer 134 is affixed to the side 126 of the die 108 such that the conductive stud 132 enters the first side 140 of the first dielectric layer 134. In step 405, a first via 156 is formed through the first dielectric layer 134 between the conductive stud 132 and the second side 142 of the first dielectric layer 134 wherein the first via 156 is electrically connected to the conductive stud 132.

Figure 15:
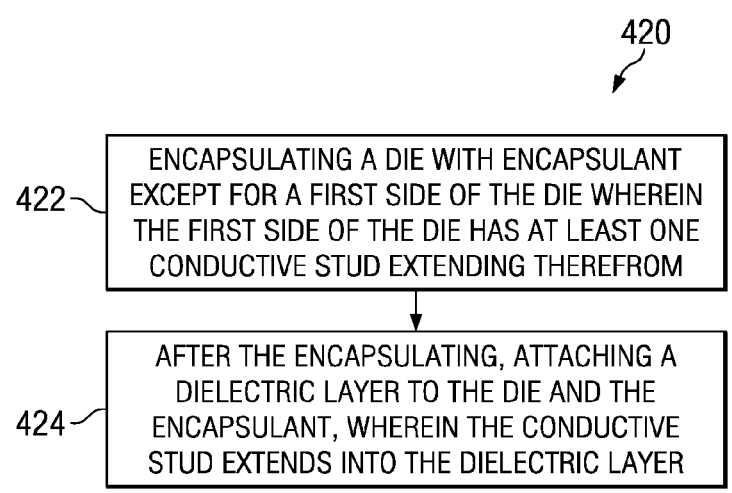
FIG. 15 is a flow chart describing another embodiment of fabricating the die of FIG. 1.

Another embodiment of a method of fabricating a circuit is described by a flow chart 420 of FIG. 15. The method commences at step 422 with encapsulating a die 108 with an encapsulant 106 except for a first side 120 of the die 108, wherein the first side 120 of the die 108 has at least one conductive stud 132 extending therefrom. The method concludes at step 424 with attaching a dielectric layer 134 to the die 108 and the encapsulant 106 after the encapsulating process, wherein the conductive stud 132 extends into the dielectric layer 134.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A method of fabricating a circuit, said method comprising:
   providing a die, said die having a side;
   applying an encapsulant in an uncured state to said die, except for said side;
   affixing a conductive stud directly on said die which extends from said side;
   affixing a first dielectric layer in an uncured state to said side of said die, when the encapsulant is in the uncured state, said first dielectric layer having a first side and a second side, wherein said first side of said first dielectric layer is affixed to said side of said die, said conductive stud piercing said first side of said first dielectric layer;
   forming a first via through said first dielectric layer between said conductive stud and said second side, wherein said first via is electrically connected to said conductive stud; and
   curing said uncured encapsulant and said first dielectric layer in the uncured state.

2. The method of claim 1, wherein curing said uncured encapsulant and said first dielectric layer in the uncured state comprises:
   curing said uncured encapsulant and said first dielectric layer in the uncured state, simultaneously.

3. The method of claim 1, and further comprising locating said die proximate a heat spreader.

4. The method of claim 1, and further comprising affixing a conductive layer to said second side, said conductive layer electrically connected to said first via.

5. The method of claim 4 and further comprising:
affixing a second dielectric layer to said conductive layer, said second dielectric layer having a first side and a second side, wherein said first side of said second dielectric layer is located adjacent said conductive layer; and
forming a second via between said conductive layer and said second side of said second dielectric layer.

6. The method of claim 5 and further comprising affixing a connection mechanism to said second side of said second dielectric layer, said connection mechanism being electrically connected to said second via.

7. The method of claim 1, wherein said affixing the first dielectric layer comprises affixing a first dielectric material to a carrier and applying said dielectric material with said carrier to said side of said die.

8. The method of claim 7 and further comprising removing said carrier.

9. A method of fabricating a circuit, said method comprising:
providing a die, said die having a side, wherein a conductive stud extends from said side in a direction that is substantially normal to said side;
affixing a first dielectric layer to said side of said die, said first dielectric layer having a first side and a second side, wherein said first side of said first dielectric layer is affixed to said side of said die;
piercing said first side of said first dielectric layer with said conductive stud;
forming a first via through said first dielectric layer between said conductive stud and said second side, wherein said first via is electrically connected to said conductive stud;
applying an uncured encapsulant to said die; and
curing said encapsulant and said first dielectric layer simultaneously.

10. The method of claim 9, wherein said first dielectric layer has a conductive layer affixed to said second side and further comprising electrically connecting said conductive layer to said first via.

11. The method of claim 10 and further comprising:
affixing a second dielectric layer to said conductive layer, said second dielectric layer having a first side and a second side, wherein said first side of said second dielectric layer is located adjacent said conductive layer; and
forming a second via between said conductive layer and said second side of said second dielectric layer.

12. The method of claim 11 and further comprising affixing a connection mechanism to said second side of said second dielectric layer, said connection mechanism being electrically connected to said second via.

* * * * *